United States Patent
Kim (10) Patent No.: US 9,076,512 B2
(45) Date of Patent: Jul. 7, 2015

(54) SYNCHRONOUS NONVOLATILE MEMORY DEVICE AND MEMORY SYSTEM SUPPORTING CONSECUTIVE DIVISION ADDRESSING DRAM PROTOCOL

(71) Applicant: Jin-Hyun Kim, Hwaseong-si (KR)

(72) Inventor: Jin-Hyun Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 287 days.

(21) Appl. No.: 13/724,835

(22) Filed: Dec. 21, 2012

(65) Prior Publication Data

US 2013/0272052 A1    Oct. 17, 2013

(30) Foreign Application Priority Data

Apr. 16, 2012   (KR) .................. 10-2012-0039323

(51) Int. Cl.
  *G11C 11/22* (2006.01)
  *G11C 8/18* (2006.01)
  *G11C 11/21* (2006.01)
  *G11C 7/10* (2006.01)
  *G11C 13/00* (2006.01)
  *G11C 7/22* (2006.01)
  *G11C 11/16* (2006.01)

(52) U.S. Cl.
  CPC *G11C 8/18* (2013.01); *G11C 11/21* (2013.01); *G11C 11/22* (2013.01); *G11C 11/16* (2013.01); *G11C 7/10* (2013.01); *G11C 13/0023* (2013.01); *G11C 7/22* (2013.01)

(58) Field of Classification Search
  CPC ........ G11C 8/18; G11C 7/22; G11C 13/0023; G11C 11/21; G11C 7/10; G11C 11/22; G11C 11/16
  USPC ............ 365/145, 157, 158, 171, 173, 189.04, 365/189.05, 189.14, 189.17, 203, 233.13
  See application file for complete search history.

(56) References Cited

U.S. PATENT DOCUMENTS

| | | | |
|---|---|---|---|
| 6,970,378 B2 | 11/2005 | Hidaka | |
| 7,079,148 B2 | 7/2006 | Sharma et al. | |
| 2005/0204091 A1* | 9/2005 | Kilbuck et al. | 711/103 |
| 2005/0237820 A1* | 10/2005 | Takemura et al. | 365/189.05 |
| 2008/0235468 A1 | 9/2008 | Chen et al. | |
| 2012/0195148 A1* | 8/2012 | Yoko | 365/219 |

FOREIGN PATENT DOCUMENTS

KR    1020090031127 A    3/2009

* cited by examiner

*Primary Examiner* — Thao H Bui
(74) *Attorney, Agent, or Firm* — Sughrue Mion, PLLC (57) ABSTRACT

A nonvolatile memory device and system having a nonvolatile memory device accessible with a DRAM protocol for generating a first command signal and a second command signal based on a row address strobe signal and a column address strobe signal and storing an n-bit row address signal based on the first command signal, an n-bit column address signal based on the second command signal, and decoding the n-bit row address signal and the n-bit column address signal to synchronously provide a row selection signal and a column selection signal to a memory cell array.

14 Claims, 6 Drawing Sheets

| CMD | CONTROL SIGNALS | | | | |
|---|---|---|---|---|---|
| | /CS | /RAS | /CAS | /WE | |
| NOP | L | H | H | H | NON OPERATION |
| ROW ACT | L | L | H | H | ROW ADDRESS FOR READ/WRITE |
| READ | L | H | L | H | COLUMN ADDRESS FOR READ |
| WRITE | L | H | L | L | COLUMN ADDRESS FOR WRITE |
| PRE | L | H | H | H | NON ACTIVATION |

FIG. 5

SYNCHRONOUS NONVOLATILE MEMORY DEVICE AND MEMORY SYSTEM SUPPORTING CONSECUTIVE DIVISION ADDRESSING DRAM PROTOCOL

CROSS-REFERENCE TO RELATED APPLICATION

This application claims priority under 35 USC §119 from Korean Patent Application No. 2012-0039323, filed on Apr. 16, 2012, in the Korean Intellectual Property Office (KIPO), the contents of which are herein incorporated by reference in their entirety.

BACKGROUND

1. Technical Field

Exemplary embodiments relate generally to semiconductor memory devices, and more particularly to nonvolatile memory devices and memory systems including the nonvolatile memory devices.

2. Description of the Related Art

Semiconductor memory devices may be respectively categorized as nonvolatile or volatile in nature according to their ability or inability to retain stored data in the absence of applied power. A magnetic random access memory (MRAM), which is a kind of the nonvolatile memory device, has characteristics such as the high integration equal to that of a dynamic random access memory (DRAM), the speed faster than that of a static random access memory (SRAM), and the power consumption lower than that of the DRAM or the SRAM.

However, since the MRAM employs a current sensing method, column and row addresses must be simultaneously designated upon a read/write operation. Both of n row address terminals and n column address terminals must be simultaneously provided, and thus 2n address terminals are required in the MRAM. As the number of address input terminals is increased, the packaging cost of a memory chip may rise. The increase of the packaging cost of the memory chip becomes one of major problems in lowering the product cost of the MRAM.

In addition, the MRAM may not be compatible with DRAM access environment in which the access to a memory cell is performed by sequentially applying an n-bit row address signal and an n-bit column address signal. To compatibly employ the MRAM under the conventional DRAM access environment, an address bus structure must be established between a memory controller and a DRAM memory, and an address bus structure dedicated for another MRAM must be additionally established, which results in a complex hardware and software system design.

SUMMARY

One or more exemplary embodiments may obviate one or more problems due to limitations and disadvantages of the related art. However, it is understood that one or more exemplary embodiments are not required to overcome the disadvantages described above, and may not overcome any of the problems described above.

According to an aspect of an exemplary embodiment, there is provided a nonvolatile memory device accessible with a DRAM protocol.

According to an aspect of an exemplary embodiment, there is provided a memory system including the nonvolatile memory device accessible with the DRAM protocol.

The nonvolatile memory device may include a memory cell array, address input terminals, an address decoder and a command conversion controller. The memory cell array includes a plurality of memory cells. The plurality of memory cells include a first memory cell being connected to a first wordline of a plurality of wordlines and a first bitline of a plurality of bitlines and a second memory cell being connected to a second wordline of the plurality of wordlines and a second bitline of the plurality of bitlines. The address input terminals sequentially receive an n-bit row address signal and an n-bit column address signal. The command conversion controller generates a first command signal and a second command signal based on a row address strobe signal and a column address strobe signal. The address decoder stores the n-bit row address signal based on a first command signal, stores the n-bit column address signal based on a second command signal, and decodes the n-bit row address signal and the n-bit column address signal to synchronously provide a row selection signal and a column selection signal to the memory cell array.

The row address strobe signal and the column address strobe signal may be generated based on a dynamic random access memory (DRAM) protocol.

The command conversion controller may further generate a third command signal to disable a precharge operation for the nonvolatile memory device based on the row address strobe signal and the column address strobe signal.

The first command signal may correspond to an active command for enabling the plurality of wordlines, and the second command signal may correspond to a read command for reading data stored in the memory cell array or a write command for storing data in the memory cell array.

The row selection signal and the column selection signal may be synchronously provided to the memory cell array by at least partially overlapping an active duration of the row selection signal with an active duration of the column selection signal.

The address decoder may include a row address buffer, a column address buffer, a row decoder and a column decoder. The row address buffer may latch the n-bit row address signal based on the first command signal and may output the latched n-bit row address signal based on the second command signal. The column address buffer may latch the n-bit column address signal based on the second command signal and may output the latched n-bit column address signal after a half cycle of a clock signal is elapsed from which the latched n-bit row address signal are output from the row address buffer based on the second command signal. The row decoder may decode the n-bit row address signal output from the row address buffer to generate the row selection signal and may provide the row selection signal to the plurality of wordlines. The column decoder may decode the n-bit column address signal output from the column address buffer to generate the column selection signal and may provide the column selection signal to the plurality of bitlines in synchronization with the row selection signal.

The row address buffer may delay the latched n-bit row address signal by a row-to-column delay time to provide the delayed n-bit row address signal to the row decoder.

The row address buffer may include a row address latch and a row address delay unit. The row address latch may latch the n-bit column address signal based on the first command signal. The row address delay unit may delay the latched n-bit row address signal and may output the delayed n-bit row address signal based on the second command signal.

The nonvolatile memory device may include one of a phase change random access memory (PRAM), a resistance random access memory (RRAM), a magnetic random access memory (MRAM), and a ferroelectric random access memory (FRAM).

According to an aspect of an exemplary embodiment, a memory system may include a memory controller and a nonvolatile memory device. The memory controller generates a row address strobe signal, a column address strobe signal, an n-bit row address signal and an n-bit column address signal. The nonvolatile memory device performs a read operation or a write operation based on the row address strobe signal, the column address strobe signal, the n-bit row address signal and the n-bit column address signal. The nonvolatile memory device includes a memory cell array, address input terminals, an address decoder and a command conversion controller. The memory cell array includes a plurality of memory cells. The plurality of memory cells may include a first memory cell being connected to a first wordline of a plurality of wordlines and a first bitline of a plurality of bitlines and a second memory cell being connected to a second wordline of the plurality of wordlines and a second bitline of the plurality of bitlines. The address input terminals sequentially receive the n-bit row address signal and the n-bit column address signal. The command conversion controller configured to generate a first command signal and a second command signal based on a row address strobe signal and a column address strobe signal. The address decoder stores the n-bit row address signal based on a first command signal, stores the n-bit column address signal based on a second command signal, and decodes the n-bit row address signal and the n-bit column address signal to synchronously provide a row selection signal and a column selection signal to the memory cell array.

The memory controller may be configured to generate the row address strobe signal, the column address strobe signal, the n-bit row address signal, and the n-bit column address signal based on a dynamic random access memory (DRAM) protocol.

The n-bit row address signal and the n-bit column address signal may be internally synchronized by latching the n-bit row address signal, by delaying the latched n-bit row address signal, by latching the n-bit column address signal, and by simultaneously decoding the delayed n-bit row address signal and the latched column address signal such that an active duration of the row selection signal decoded from the n-bit row address signal is at least partially overlapped with an active duration of the column selection signal decoded from the n-bit column address signal.

The address decoder may include a row address buffer, a column address buffer, a row decoder and a column decoder. The row address buffer may latch the n-bit row address signal based on the first command signal and may output the latched n-bit row address signal based on the second command signal. The column address buffer may latch the n-bit column address signal based on the second command signal and may output the latched n-bit column address signal after a half cycle of a clock signal is elapsed from which the latched n-bit row address signal are output from the row address buffer based on the second command signal. The row decoder may decode the n-bit row address signal outputted from the row address buffer to generate the row selection signal and may provide the row selection signal to the plurality of wordlines. The column decoder may decode the n-bit column address signal outputted from the column address buffer to generate the column select signal and may provide the column selection signal to the plurality of bitlines in synchronization with the row selection signal.

The row address buffer may delay the latched n-bit row address signal by a row-to-column delay time to provide the delayed n-bit row address signal to the row decoder.

The memory system may further include a control bus, an address bus and a data bus. The control bus may transmit the row address strobe signal and the column address strobe signal to the nonvolatile memory device. The address bus may transmit the n-bit row address signal and the n-bit column address signal to the nonvolatile memory device. The data bus may transmit read data from the nonvolatile memory device to the memory controller or may transmit write data from the memory controller to the nonvolatile memory device. Because the nonvolatile memory device (e.g., the MRAM) according to example embodiments is accessible with a DRAM protocol, the nonvolatile memory may substitute for a DRAM in an existing DRAM access system. Further, the MRAM can be compatibly used with the DRAM without changing memory control of a system. Since the number of address terminals in the MRAM can be significantly reduced in half, the MRAM can be produced at the low cost.

According to an aspect of an exemplary embodiment, a memory control method may include sequentially receiving an n-bit row address signal and an n-bit column address signal, receiving a row address strobe signal and a column address strobe signal, generating a first command signal and a second command signal based on the row address strobe signal and the column address strobe signal, storing the n-bit row address signal based on the first command signal, storing the n-bit column address signal based on the second command signal, decoding the n-bit row address signal and the n-bit column address signal, and synchronously providing a row selection signal and a column selection signal to a memory cell array based on the decoded n-bit row address signal and the decoded n-bit column address signal.

The row address strobe signal and the column address strobe signal may be generated based on a dynamic random access memory (DRAM) protocol.

The memory cell array may include a plurality of memory cells, the plurality of memory cells including a first memory cell being connected to a first wordline of a plurality of wordlines and a first bitline of a plurality of bitlines and a second memory cell being connected to a second wordline of the plurality of wordlines and a second bitline of the plurality of bitlines.

The exemplary embodiments are not limited to the above effects. Other effects can be clearly understood by those skilled in art within the present inventive concepts.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EXEMPLARY EMBODIMENTS

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third, etc., may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Hereinafter, exemplary embodiments will be described with reference to accompanying g drawings. The same elements shown in the drawings will be assigned with the same reference numerals, and the details thereof will be omitted in order to avoid redundancy.

Figure 1A:
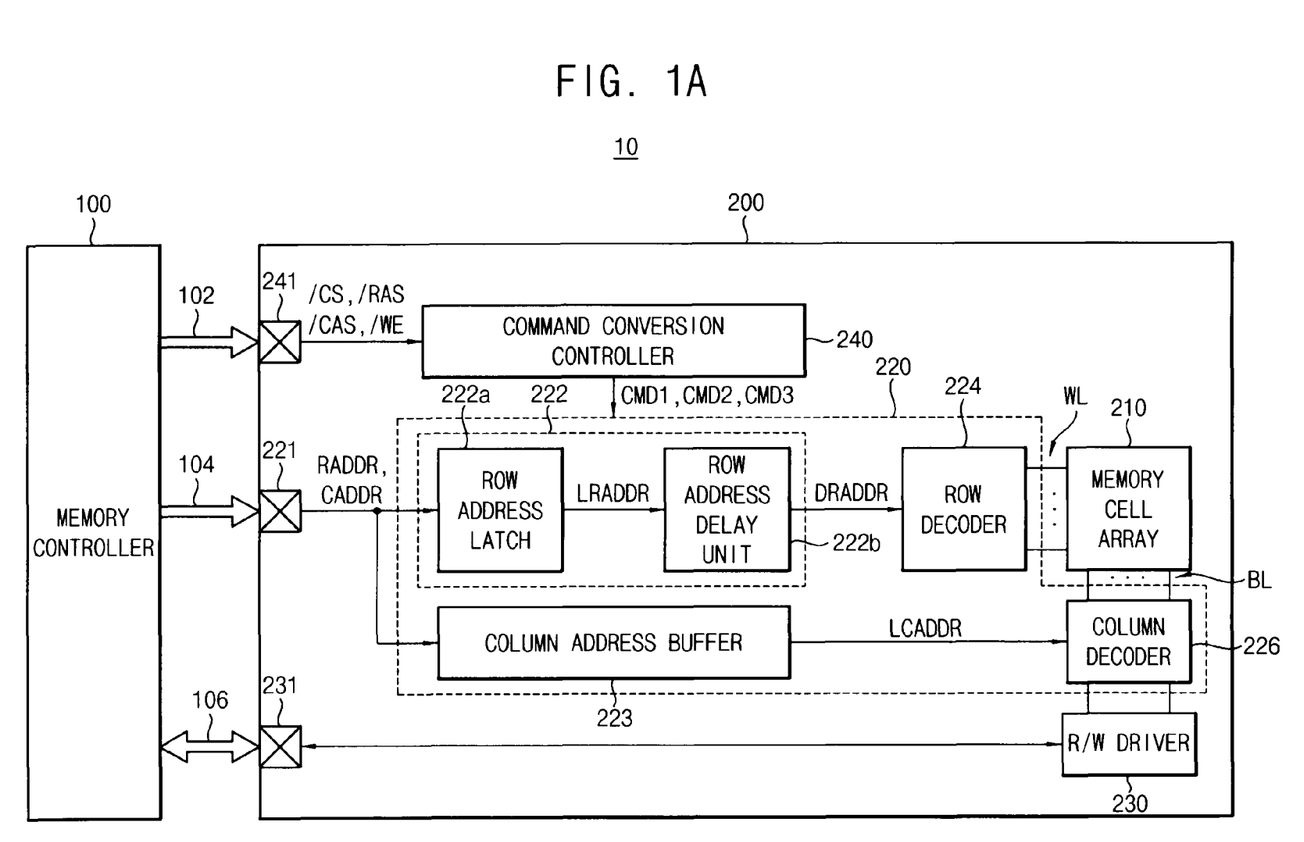
FIG. 1A is a block diagram illustrating a memory system according to an exemplary embodiment.
Figure 1B:
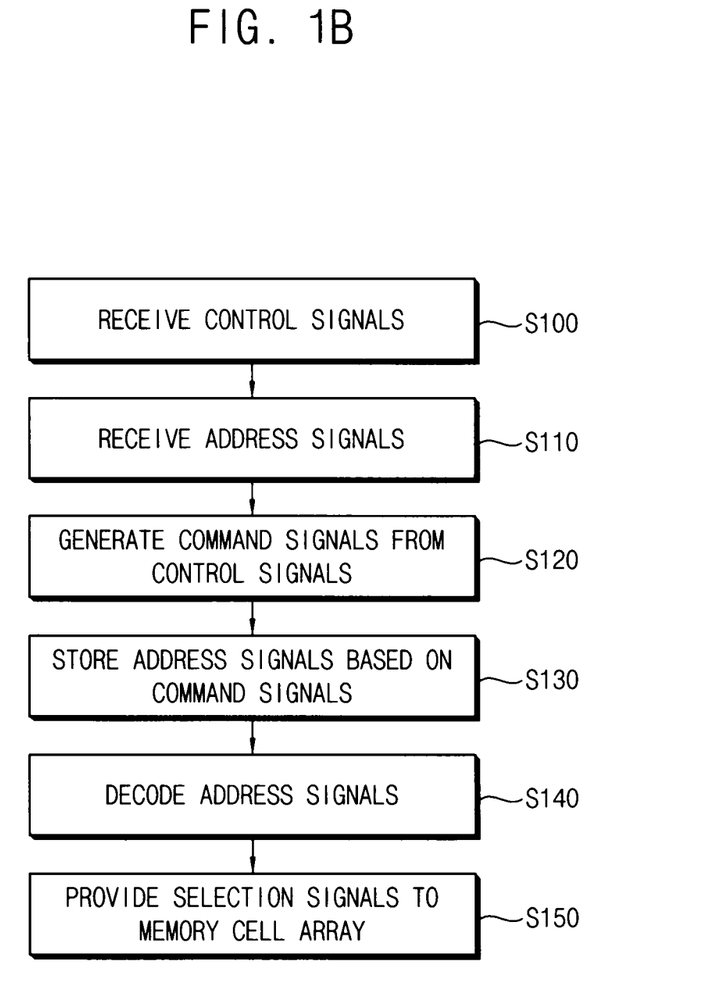
FIG. 1B is a flowchart illustrating a memory control method according to an exemplary embodiment.

FIG. 1A is a block diagram illustrating a memory system according to an exemplary embodiment. FIG. 1B is a flowchart illustrating a memory control method according to an exemplary embodiment.

A nonvolatile memory device and a memory system according to exemplary embodiments may operate based on a current sensing method, in which column and row addresses must be simultaneously designated upon a read/write operation. Hereinafter, the nonvolatile memory device according to example embodiments will be described based on a magnetic random access memory (MRAM). However, the nonvolatile memory device according to example embodiments may be one of various nonvolatile memory devices, such as a phase change random access memory (PRAM), a resistance random access memory (RRAM), a ferroelectric random access memory (FRAM), etc.

Referring to FIGS. 1A and 1B, a memory system 10 includes a memory controller 100 and a nonvolatile memory device 200, e.g., a MRAM. The memory system 10 may further include a control bus 102, an address bus 104 and a data bus 106.

The memory controller 100 generates control signals and address signals based on a DRAM protocol, and transmits the control signals and the address signals to the nonvolatile memory device 200 through the control bus 102 and the address bus 104, respectively, and the memory device 200 receives the control signals (step S100) and address signals (step S110) from the memory controller 100. For example, the control signals may include a chip selection signal /CS, a row address strobe signal /RAS, a column address strobe signal /CAS, and a write enable signal /WE. The address signals may include an n-bit row address signal RADDR and an n-bit column address signal CADDR, where n is a natural number. The memory controller 100 reads data from the nonvolatile memory device 200 or stores data in the nonvolatile memory device 200 through the data bus 106 based on the control signals and the address signals.

Hereinafter, the DRAM protocol indicates a typical signal interface between a DRAM device and a memory controller. Particularly, the DRAM protocol may indicate that the strobe signals /RAS and /CAS are controlled such that the address signals RADDR and CADDR are not simultaneously applied from the memory controller to the DRAM device, but sequentially applied from the memory controller to the DRAM device. For example, in a read/write operation based on the DRAM protocol, the row address strobe signal /RAS is activated to receive the row address signal RADDR, and then the column address strobe signal /CAS is activated to receive the column address signal CADDR after a row-to-column delay time has elapsed.

If it is assumed that the bit number of an address signal of a conventional MRAM is 2n (e.g. if it is assumed that an address bus of the conventional MRAM has 2n-bit width), the address bus 104 may have an n-bit width corresponding to a half of the bit number of the address signal of the conventional MRAM because the exemplary embodiments employ a division addressing scheme. In other words, the width of the address bus 104 may be equal to a width of an address bus of a conventional DRAM, which corresponds to the n-bit width. The memory controller 100 may employ a conventional DRAM access control scheme, which is referred to as a division addressing scheme. For example, the memory controller 100 may generate the n-bit row address signal RADDR simultaneously with an active command for enabling a plurality of wordlines WL, and then may generate the n-bit column address signal CADDR simultaneously with a read command for reading data or a write command for storing data after a predetermined time (e.g., a row-to-column delay time) is elapsed, thereby selecting specific memory cells. Data may be written into the selected memory cells or may be read from the specified memory cells.

The nonvolatile memory device 200 performs a read operation or a write operation based on the control signals and the address signals. The nonvolatile memory device 200 includes a memory cell array 210, an address decoder 220, a read/write driver 230 and a command conversion controller 240. The nonvolatile memory device 200 may further include address input terminals 221, data input/output (I/O) terminals 231 and control input terminals 241.

The memory cell array 210 includes a plurality of memory cells. Each memory cell is connected to a respective one of the plurality of wordlines WL and a respective one of a plurality of bitlines BL. Each memory cell may be a magneto-resistive element such as tunneling magneto-resistive (TMR) element, or giant magneto-resistive (GMR) element. The plurality of memory cells included in the memory cell array may be arranged in rows and columns. The rows may extend in an X-axis direction, and the columns may extend in a Y-axis direction (the directions are relatively defined).

The rows of the memory cell array 210 may be referred to as the wordlines WL, and the columns of the memory cell array 210 may be referred to as the bitlines BL. Each memory cell may be located at the interconnection between a respective one of the wordlines WL and a respective one of the bitlines BL. A data layer of the memory cell is read as either "0" or "1" depending on magnetization orientation thereof based on the reference layer. The characteristics with respect to a magnetized layer such as the data layer may be referred to as coercivity. The coercivity may correspond to the amount of force to maintain the magnetization orientation of the data layer. In other words, to flip (e.g., switch) the data layer from one logic state to another logic state (e.g., from "0" to "1" or from "1" to "0"), an external magnetic field greater than the coercivity of the data layer must be applied to the data layer. To switch a logic state of a selected memory cell, current is applied to the bitline and the wordline corresponding to the selected memory cell. When the magnetic field generated by the current is sufficiently great to exceed a coercivity threshold value, the logic state of the selected memory cell may be flipped (e.g., the orientation of the data layer of the selected memory cell is changed). MRAM devices may be designed to destruct a proper balance between the coercivity and the current applied to the bitlines and the wordlines. If the coercivity is excessively low, the memory cell may be unstable, so that the magnetic field undesirably exceeds the coercivity threshold value due to temperature fluctuations. In this case, the logic value may be switched. The increase of the coercivity represents the increase of the current applied to the bitlines and the wordlines.

In other words, to read data from the memory cell array 210 or store data in the memory cell array 210 in the MRAM, timing synchronization, in which at least portions of active durations of current pulses flowing through both the wordlines WL and the bitlines BL may be overlapped with each other, must be achieved.

The address decoder 220 stores the n-bit row address signal RADDR based on a first command signal CMD1 (step S130), stores the n-bit column address signal CADDR based on a second command signal CMD2 (step S130), and decodes the n-bit row address signal RADDR and the n-bit column address signal CADDR (step S150) to synchronously provide a row selection signal and a column selection signal to the memory cell array 210 (step S160). The address decoder 220 may include a row address buffer 222, a column address buffer 223, a row decoder 224, and a column decoder 226.

The address input terminals 221 sequentially receive the n-bit row address signal RADDR and an n-bit column address signal CADDR. The row address buffer 222 may latch the n-bit row address signal RADDR, which is input prior to the n-bit column address signal CADDR through the address input terminals 221, based on the first command signal CMD1 and may output the latched signal based on the second command signal CMD2. In this case, the row address buffer 222 may delay the latched n-bit row address signal LRADDR by the row-to-column delay time to provide the delayed n-bit row address signal DRADDR to the row decoder 224. For example, the row address buffer 222 may include a row address latch 222*a* that latches the n-bit column address signal RADDR based on the first command signal CMD1, and a row address delay unit 222*b* that delays the latched n-bit row address signal LRADDR and outputs the delayed n-bit row address signal DRADDR based on the second command signal CMD2. The row address latch 222*a* may include at least one latch circuit, and the row address delay unit 222*b* may include a plurality of buffers (e.g., inverters) that are cascade-connected.

The column address buffer 223 may latch the n-bit column address signal CADDR, which is input subsequent to the n-bit row address signal RADDR through the address signal terminals 221, based on the second command signal CMD2 and may output the latched n-bit column address signal LCADDR after a half cycle of a clock signal is elapsed from which the latched signal (e.g., the delayed n-bit row address signal DRADDR) are output from the row address buffer 222 based on the second command signal CMD2. The column address buffer 223 may include at least one latch circuit.

In other words, the former-input row address signal RADDR may be delivered to the row decoder 224 via the delay unit 222*b* for the purpose of timing synchronization (timing in which at least portions of the active pulse durations are overlapped with each other) with the later-input column address signal CADDR. The column address signal CADDR, which have been later input, may be delivered to the column decoder 226 without delay.

The row decoder 224 may decode the n-bit row address signal (e.g., the delayed n-bit row address signal DRADDR) output from the row address buffer 222 to generate the row selection signal and may provide the row selection signal to the plurality of wordlines WL. The column decoder 226 may decode the n-bit column address signal (e.g., the latched n-bit column address signal LCADDR) output from the column address buffer 223 to generate the column selection signal and may provide the column selection signal to the plurality of bitlines BL in synchronization with the row selection signal. Accordingly, the row selection signal, which is obtained through decoding in the row decoder 224, and the column selection signal, which is obtained through decoding in the column decoder 226, may be timing-synchronized with each other and may be applied to the wordlines WL and the bitlines BL of the memory cell array 210.

The read/write driver 230 may receive read data, which is cell data of a bitline BL selected by the column decoder 226, from the selected memory cells during a read operation. The data I/O terminals 231 may output the read data, and the read data may be transmitted to the memory controller 100 through the data bus 106 during the read operation. The data I/O terminals 231 may receive write data from the memory controller 100 through the data bus 106 during a write operation. The read/write driver 230 may transmit the write data to the selected memory cells, e.g., to the bitline BL selected by the column decoder 226, during the write operation.

The command conversion controller 240 decodes the control signals input through the control input terminals 241 to generate command signals (step S120) and supplies the command signals to the address decoder 220. For example, the command conversion controller 240 generates the first command signal CMD1 and the second command signal CMD2 based on the row address strobe signal /RAS and the column address strobe signal /CAS, and controls the address decoder 220 based on the first command signal CMD1 and the second command signal CMD2. As described above, the row address strobe signal /RAS and the column address strobe signal /CAS are generated based on the DRAM protocol. The first command signal CMD1 corresponds to the active command for enabling the plurality of wordlines WL, and the second command signal CMD2 corresponds to the read command for reading data stored in the memory cell array 210 or the write command for storing data in the memory cell array 210.

In exemplary embodiments, the command conversion controller 240 may further generate a third command signal CMD3 to disable a precharge operation for the nonvolatile memory device 200 based on the row address strobe signal /RAS and the column address strobe signal /CAS. The precharge operation is not performed because the precharge operation is unnecessary in the MRAM. In other words, the command conversion controller 240 may use the same timing based on the conventional DRAM protocol, may convert only a command necessary in the MRAM, and may disable unnecessary remaining DRAM commands (e.g., may block command decoding with respect to unnecessary operations).

In exemplary embodiments, the memory system 10 may be included in an electronic device such as a computer system, a personal computer (PC), a laptop computer, a tablet computer, a smart phone, an MP3 player, a USB storage device, a smart card, a semiconductor memory storage device, a semiconductor memory module, or a multi-memory chip module.

Figure 2:
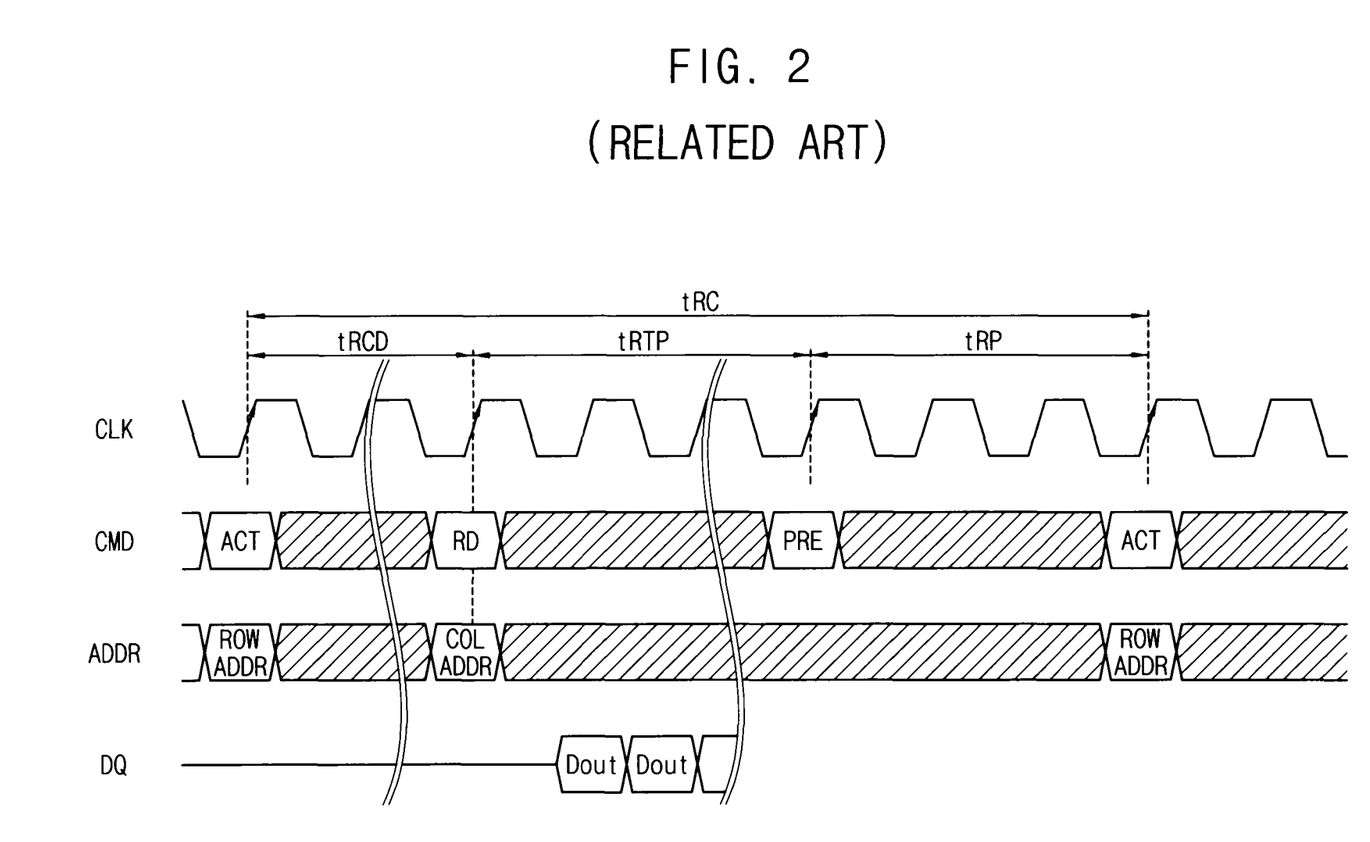
FIG. 2 is a timing diagram for describing a read operation in a conventional DRAM access scheme.

FIG. 2 is a timing diagram for describing a read operation in a conventional DRAM access scheme. In FIG. 2, CLK indicates a clock signal, CMD indicates the command signals, ADDR indicates the address signals, and DQ indicates the read data. In addition, tRCD, tRTP, tRP and tRC indicate a row-to-column delay time, a read-to-precharge delay time, a row precharge time, and a read cycle time, respectively.

Referring to FIG. 2, in the conventional DRAM access scheme, a row address signal "ROW ADDR", which is output from a memory controller through an address bus, is latched in an address buffer when an active command "ACT" is received at a rising edge of the clock signal CLK. The row address signal "ROW ADDR" drives a wordline selected by a row decoder, and thus data stored in a memory cell connected to the selected wordline is voltage-divided on a bitline pair. After a row-to-column delay time tRCD has been elapsed, a column address signal "COL ADDR" is latched in the address buffer when a read command signal "RD" is received at another rising edge of the clock signal CLK. The column address signal "COL ADDR" allows a bitline, which is selected through a column decoder, to be sense-amplified. Accordingly, sense-amplified data "Dout" is applied to a data I/O line pair by a read/write driver. In other words, after a column address access time has been elapsed, the data Dout, which has been applied to the data I/O line pair, is output to a memory controller through data I/O terminals and a data bus.

Figure 3A:
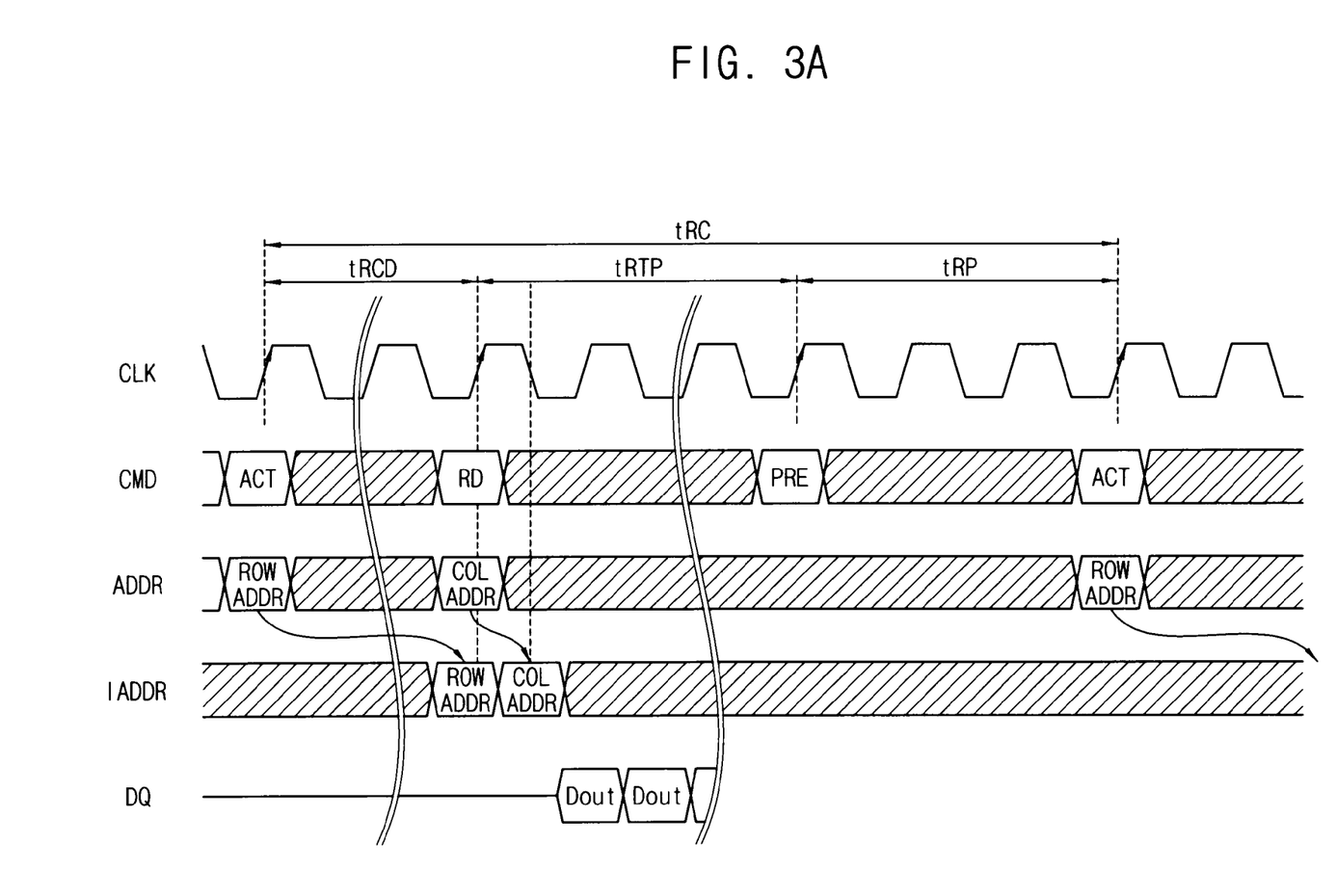
FIGS. 3A and 3B are timing diagrams for describing a read operation in a nonvolatile memory device included in the memory system according to an exemplary embodiment.
Figure 3B:
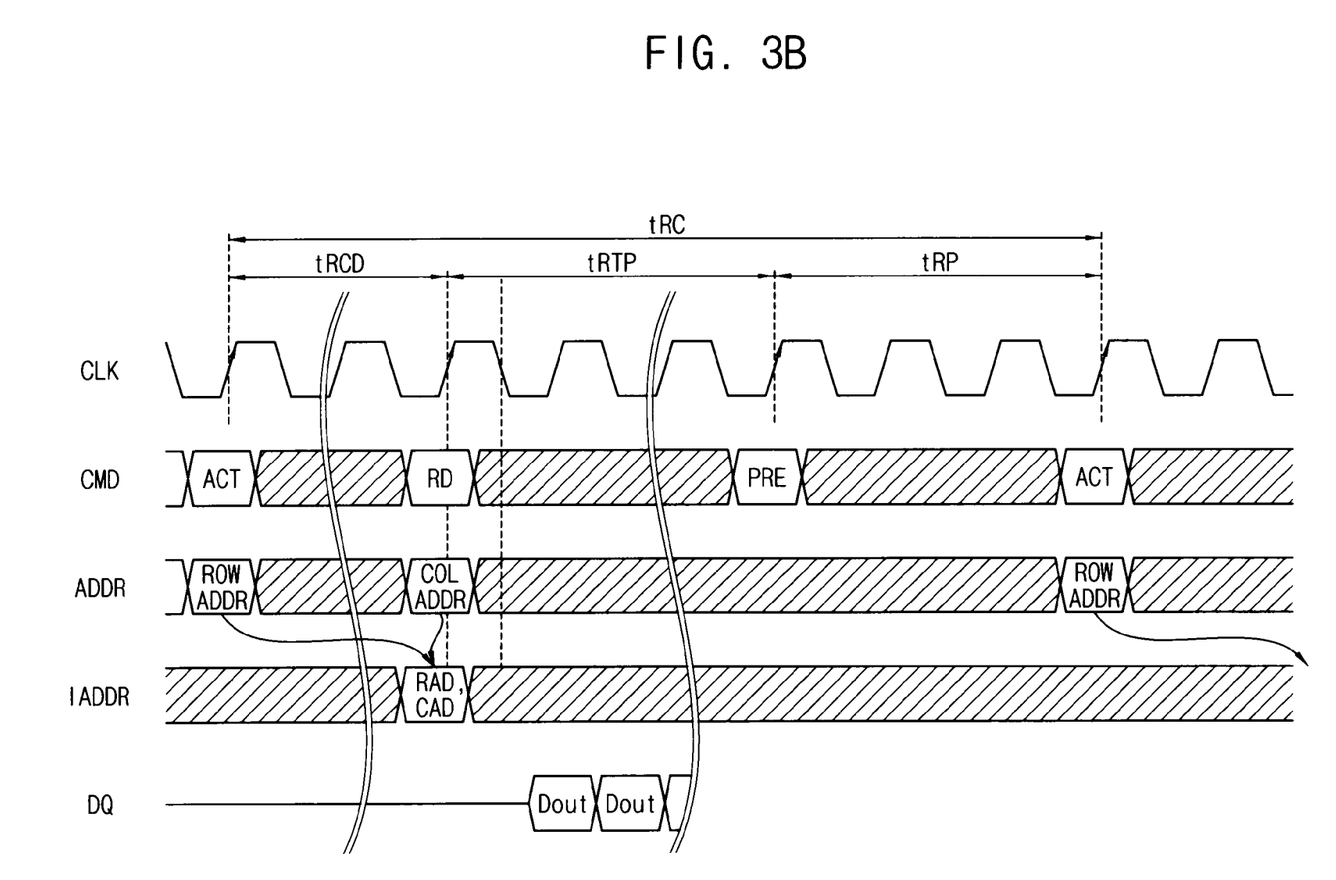
Figure 4:
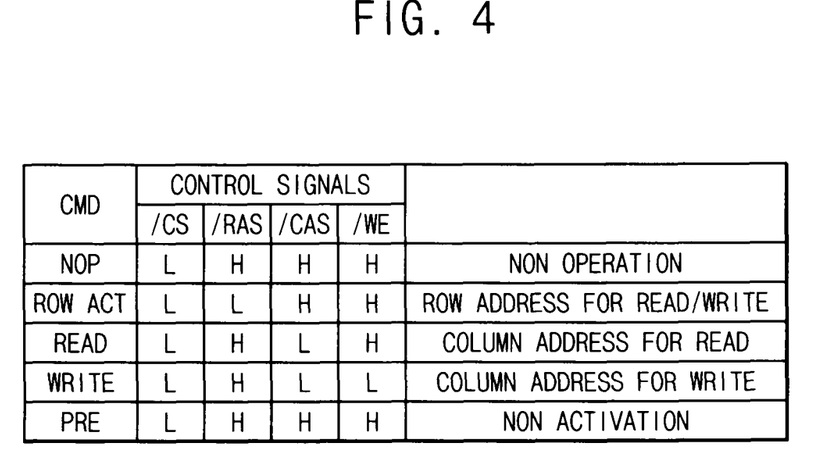
FIG. 4 is a table for describing an operation of a command conversion controller included in the memory system according to an exemplary embodiment.

FIGS. 3A and 3B are timing diagrams for describing a read operation in a nonvolatile memory device included in the memory system according to an exemplary embodiment. FIG. 4 is a table for describing an operation of a command conversion controller included in the memory system according to an exemplary embodiment.

In FIGS. 3A and 3B, IADDR indicates internal address signals that include internally synchronized row and column address signals. In FIG. 4, NOP indicates a command to disable the nonvolatile memory device 200. ROW ACT indicates a command to receive a row address signal for the read or write operation. READ indicates a command to receive a column address signal for the read operation. WRITE indicates a command to receive a column address signal for the write operation. PRE indicates a command for the precharge operation.

Referring to FIGS. 3A, 3B and 4, the memory controller 100 that operates based on the conventional DRAM access scheme outputs the chip selection signal /CS, the row address strobe signal /RAS, the column address strobe signal /CAS, and the write enable signal /WE as the control signals. The logic levels of the chip selection signal /CS, the row address strobe signal /RAS, the column address strobe signal /CAS, and the write enable signal /WE are changed depending on a type of the command, as illustrated in FIG. 4.

The nonvolatile memory device 200 receives the row address strobe signal /RAS having a logic low level "L" and the column address strobe signal /CAS having a logic high level "H" at a rising edge of the clock signal CLK. The command conversion controller 240 generates the first command signal corresponding to the active command "ACT" based on the row address strobe signal /RAS and the column address strobe signal /CAS, and simultaneously controls the row address buffer 222 to latch the row address signal "ROW ADDR".

After the row-to-column delay time tRCD has been elapsed, the nonvolatile memory device 200 receives the row address strobe signal /RAS having the logic high level "H" and the column address strobe signal /CAS having the logic low level "L" at another rising edge of the clock signal CLK. Based on the write enable signal /WE having the logic high level "H," the command conversion controller 240 generates the second command signal corresponding to the read command signal "RD" based on the row address strobe signal /RAS and the column address strobe signal /CAS, and simultaneously controls the column address buffer 223 to latch the column address signal "COL ADDR". The row address buffer 222 outputs and transfers the latched row address signal to the row decoder 224 in a rising edge of the clock signal CLK. After that, the column address buffer 223 outputs and transfers the latched column address signal to the column decoder 226 in a falling edge of the clock signal CLK.

Accordingly, as illustrated in FIG. 3A, the internal address signals IADDR is provided such that the row address signal "ROW ADDR" and the column address signal "COL ADDR" are synchronized with a time difference corresponding to a half cycle of the clock signal CLK and are transferred to the row decoder 224 and the column decoder 226, respectively. Since a wordline and a bitline are synchronously selected based on the row address signal "ROW ADDR" and the column address signal "COL ADDR" that are internally synchronized, active durations of a wordline current pulse and a bitline current pulse are overlapped each other, so that the memory controller 100 activates a corresponding memory cell. The memory controller 100 sense-amplifies a bitline cell current flowing through the activated memory cell. Sensed data is applied to a data I/O line pair by the read/write driver 230. In other words, after a column address access time has been elapsed, the data Dout, which has been supplied to the data I/O line pair, is output to the memory controller 100 through the data I/O terminals 231 and the data bus 106.

Although FIG. 3A illustrates that the row address signal "ROW ADDR" and the column address signal "COL ADDR" in the internal address signals IADDR are synchronized with the time difference corresponding to the half cycle of the clock signal CLK, if a half cycle delay characteristic is applied to a path extending to a wordline through the row decoder 224, the row address signal "ROW ADDR" (or "RAD") and the column address signal "COL ADDR" (or "CAD") in the internal address signals IADDR may be synchronized without any time difference, as illustrated in FIG. 3B (e.g., the row address signal "ROW ADDR" and the column address signal "COL ADDR" may be substantially simultaneously provided to the wordline and the bitline).

After the read-to-precharge delay time tRTP has been elapsed, the command conversion controller 240 generates the third command signal based on the row address strobe signal /RAS having the logic high level "H" and the column address strobe signal /CAS having the logic high level "H". The nonvolatile memory device 200 disables the precharge operation based on the third command signal. In other words, the precharge command "PRE" may be disabled because the logic levels of the control signals for the "PRE" command may be substantially the same as the logic levels of the control signals for the "NOP" command, as illustrated in FIG. 4. Since the nonvolatile memory device 200 such as the MRAM does not need precharge and refresh operations, the command conversion controller 240 blocks unnecessary commands among the DRAM commands. Accordingly, the nonvolatile memory device 200 (e.g., the MRAM) according to example embodiments may be accessible with the DRAM protocol.

Figure 5:
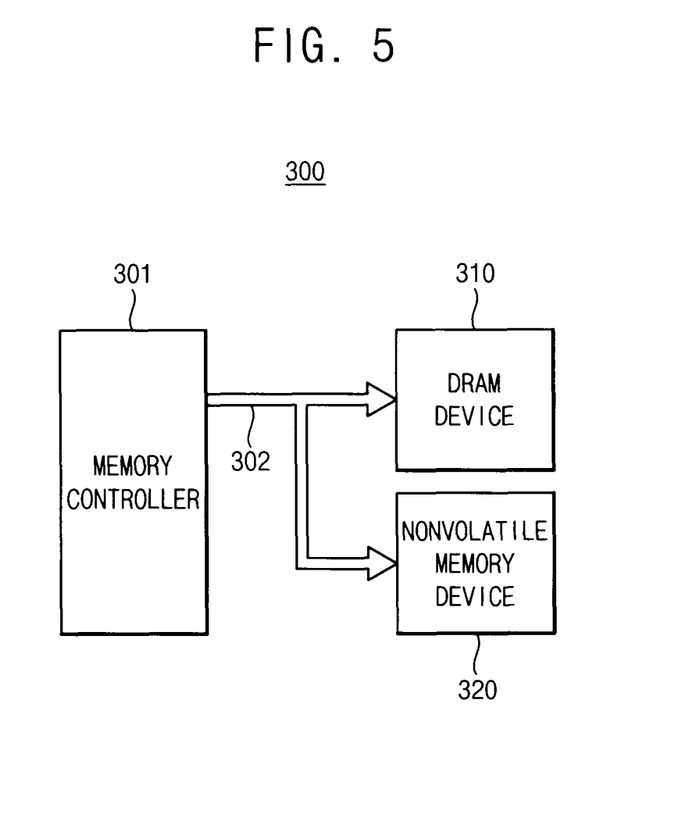
FIG. 5 is a block diagram illustrating a memory system according to an exemplary embodiment.

FIG. 5 is a block diagram illustrating a memory system according to an exemplary embodiment.

Referring to FIG. 5, a memory system 300 includes a memory controller 301, an address bus 302, a DRAM device 310, and a nonvolatile memory device 320.

The memory controller 300 is commonly connected to the DRAM device 310 and the nonvolatile memory device (e.g., the MRAM) 320 through the n-bit address bus 302. Accordingly, even if both the DRAM device 310 and the nonvolatile memory device 320 are mounted on one circuit board, the memory devices 310 and 320 may communicate with the memory controller 300 through one address bus 302 in common, and the memory controller 300 may simultaneously or selectively control the nonvolatile memory device 320 as well as the DRAM device 310 with the conventional DRAM protocol using a chip select signal /CS to access the DRAM device 310 and the nonvolatile memory device 320.

Although the exemplary embodiments are described with respect to a current sensing nonvolatile memory device by limiting the current sensing nonvolatile memory device to an MRAM for convenience of description, it may be understood that a nonvolatile memory device, such as a phase change random access memory (PRAM) or a resistive RAM (RRAM), including a resistance material can be addressed through the division addressing scheme similarly to the above exemplary embodiments only if the nonvolatile memory device synchronously activates word and bit lines within the scope of the technical spirit of the exemplary embodiments.

In addition, although the exemplary embodiments are described in that a row address delay unit is interposed between an row address buffer and a row decoder, the delay unit may be located at various positions of delaying a row address signal by time, which is set to synchronize a row address to a column address, among predetermined positions on a path that the row address signal can be applied to a word line. For example, the delay unit may be located inside the row decoder, or may be located between a terminal of the row decoder and wordlines.

In addition, although the exemplary embodiments are described with respect to only the read operation for convenience of description, it may be understood that the division addressing scheme may be performed with respect to a write operation similarly to the above exemplary embodiments if word and bit lines can be synchronously activated even in the write operation within the scope of the technical spirit of the exemplary embodiments.

Because the exemplary embodiments can access an MRAM with a DRAM protocol, the MRAM serving as a nonvolatile memory can substitute for a DRAM without changing an existing DRAM access system. Further, since the DRAM and the MRAM can be simultaneously used, the exemplary embodiments are useful to expand the application field of the MRAM.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A nonvolatile memory device, comprising:
   a memory cell array including a plurality of memory cells, the plurality of memory cells comprising a first memory cell being connected to a first wordline of a plurality of wordlines and a first bitline of a plurality of bitlines and a second memory cell being connected to a second wordline of the plurality of wordlines and a second bitline of the plurality of bitlines;
   address input terminals configured to sequentially receive an n-bit row address signal and an n-bit column address signal;
   a command conversion controller configured to generate a first command signal and a second command signal based on a row address strobe signal and a column address strobe signal; and
   an address decoder configured to store the n-bit row address signal based on the first command signal, configured to store the n-bit column address signal based on the second command signal, and configured to decode the n-bit row address signal and the n-bit column address signal to synchronously provide a row selection signal and a column selection signal to the memory cell array,
   wherein the row address strobe signal and the column address strobe signal being generated based on a dynamic random access memory (DRAM) protocol, and
   wherein the n-bit row address signal and the n-bit column address signal are internally synchronized by latching the bit row address signal, by delaying the latched n-bit row address signal, by latching the n-bit column address signal, and by simultaneously decoding the delayed n-bit row address signal and the latched column address signal such that an active duration of the row selection signal decoded from the n-bit row address signal is at least partially overlapped with an active duration of the column selection signal decoded from the n-bit column address signal.

2. The nonvolatile memory device of claim 1, wherein the command conversion controller further generates a third command signal to disable a precharge operation for the nonvolatile memory device based on the row address strobe signal and the column address strobe signal.

3. The nonvolatile memory device of claim 2, wherein the first command signal corresponds to an active command for enabling the plurality of wordlines, and the second command signal corresponds to a read command for reading data stored in the memory cell array or a write command for storing data in the memory cell array.

4. The nonvolatile memory device of claim 1, wherein the row selection signal and the column selection signal are synchronously provided to the memory cell array by at least partially overlapping an active duration of the row selection signal with an active duration of the column selection signal.

5. The nonvolatile memory device of claim 1, wherein the address decoder includes:
   a row address buffer configured to latch the n-bit row address signal based on the first command signal and configured to output the latched n-bit row address signal based on the second command signal;
   a column address buffer configured to latch the n-bit column address signal based on the second command signal and configured to output the latched n-bit column address signal after a half cycle of a clock signal is elapsed from which the latched n-bit row address signal are output from the row address buffer based on the second command signal;
   a row decoder configured to decode the n-bit row address signal output from the row address buffer to generate the row selection signal and configured to provide the row selection signal to the plurality of wordlines; and
   a column decoder configured to decode the n-bit column address signal output from the column address buffer to generate the column selection signal and configured to provide the column selection signal to the plurality of bitlines in synchronization with the row selection signal.

6. The nonvolatile memory device of claim 5, wherein the row address buffer delays the latched n-bit row address signal by a row-to-column delay time to provide the delayed n-bit row address signal to the row decoder.

7. The nonvolatile memory device of claim 6, wherein the row address buffer includes:
   a row address latch configured to latch the n-bit column address signal based on the first command signal; and
   a row address delay unit configured to delay the latched n-bit row address signal and configured to output the delayed n-bit row address signal based on the second command signal.

8. The nonvolatile memory device of claim 1, wherein the nonvolatile memory device includes one of a phase change random access memory (PRAM), a resistance random access memory (RRAM), a magnetic random access memory (MRAM), a ferroelectric random access memory (FRAM).

9. A memory system, comprising:
   a memory controller configured to generate a row address strobe signal, a column address strobe signal, an n-bit row address signal, and an n-bit column address signal; and
   a nonvolatile memory device configured to perform a read operation or a write operation based on the row address strobe signal, the column address strobe signal, the n-bit row address signal, and the n-bit column address signal,
   wherein the nonvolatile memory device comprises:
   a memory cell array including a plurality of memory cells, the plurality of memory cells comprising a first memory cell being connected to a first wordline of a plurality of wordlines and a first bitline of a plurality of bitlines and a second memory cell being connected to a second wordline of the plurality of wordlines and a second bitline of the plurality of bitlines;
   address input terminals configured to sequentially receive the n-bit row address signal and the n-bit column address signal;
   a command conversion controller configured to generate a first command signal and a second command signal based on a row address strobe signal and a column address strobe signal; and
   an address decoder configured to store the n-bit row address signal based on the first command signal, configured to store then-hit column address signal based on the second command signal, and configured to decode the n-bit row address signal and the n-bit column address signal to synchronously provide a row selection signal and a column selection signal to the memory cell array,
   wherein the memory controller is configured to generate the row address strobe signal, the column address strobe signal, the n-bit row address signal, and the n-bit column address signal based on a dynamic random access memory (DRAM) protocol,
   wherein the n-bit row address signal and the n-bit column address signal are internally synchronized by latching the n-bit row address signal by delaying the latched n-bit row address signal, by latching the n-bit column address signal, and by simultaneously decoding the delayed n-bit row address signal and the latched column address signal such that an active duration of the row selection signal decoded from the n-bit row address signal is at least partially overlapped with an active duration of the column selection signal decoded from the n-bit column address signal.

10. The memory system of claim 9, wherein the address decoder includes:
   a row address buffer configured to latch the n-bit row address signal based on the first command signal and configured to output the latched n-bit row address signal based on the second command signal;
   a column address buffer configured to latch the n-bit column address signal based on the second command signal and configured to output the latched n-bit column address signal after a half cycle of a clock signal is elapsed from which the latched n-bit row address signal are output from the row address buffer based on the second command signal;
   a row decoder configured to decode the n-bit row address signal outputted from the row address buffer to generate the row selection signal and configured to provide the row selection signal to the plurality of wordlines; and
   a column decoder configured to decode the n-bit column address signal outputted from the column address buffer to generate the column select signal and configured to provide the column selection signal to the plurality of bitlines in synchronization with the row selection signal.

11. The memory system of claim 10, wherein the row address buffer delays the latched n-bit row address signal by a row-to-column delay time to provide the delayed n-bit row address signal to the row decoder.

12. The memory system of claim 9, further comprising:

a control bus configured to transmit the row address strobe signal and the column address strobe signal to the nonvolatile memory device;

an address bus configured to transmit the n-bit row address signal and the n-bit column address signal to the nonvolatile memory device; and a data bus configured to transmit read data from the nonvolatile memory device to the memory controller or configured to transmit write data from the memory controller to the nonvolatile memory device.

13. A memory control method, comprising:

receiving a row address strobe signal and a column address strobe signal;

sequentially receiving an n-bit row address signal and an n-bit column address signal;

generating a first command signal and a second command signal based on the row address strobe signal and the column address strobe signal;

storing the n-bit row address signal based on the first command signal;

storing the n-bit column address signal based on the second command signal;

decoding the n-bit row address signal and the n-bit column address signal; and synchronously providing a row selection signal and a column selection signal to a memory cell array based on the decoded n-bit row address signal and the decoded n-bit column address signal, wherein the row address strobe signal and the column address strobe signal are generated based on a dynamic random access memory (DRAM) protocol, wherein the n-bit row address signal and the n-bit column address signal are internally synchronized by latching the n-bit row address signal, by delaying the latched n-bit row address signal, by latching the n-bit column address signal, and by simultaneously decoding the delayed n-bit row address signal and the latched column address signal such that an active duration of the row selection signal decoded from the n-bit row address signal is at least partially overlapped with an active duration of the column selection signal decoded from the n-bit column address signal.

14. The memory control method of claim 13, wherein the memory cell array includes a plurality of memory cells, the plurality of memory cells comprising a first memory cell being connected to a first wordline of a plurality of wordlines and a first bitline of a plurality of bitlines and a second memory cell being connected to a second wordline of the plurality of wordlines and a second bitline of the plurality of bitlines.

* * * * *